Figure 3:
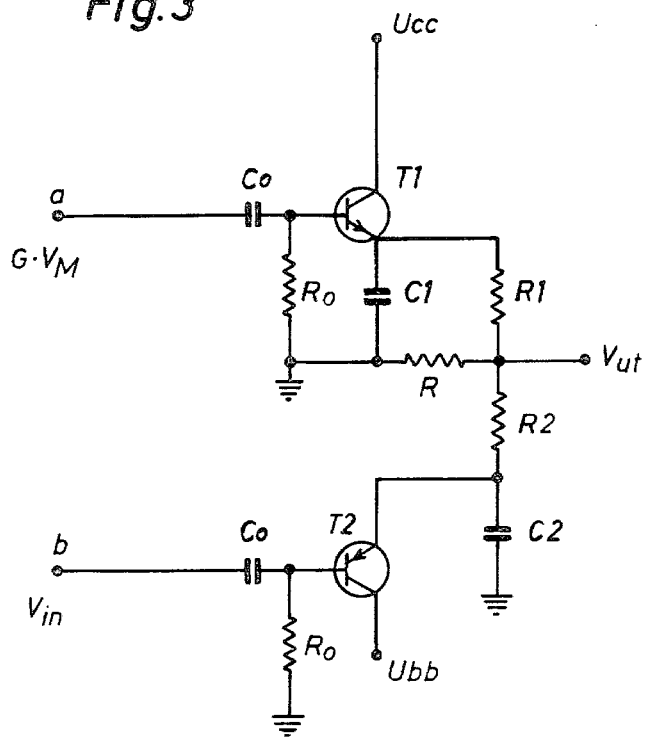

United States Patent [19]

Nilsson

[11] 4,250,453
[45] Feb. 10, 1981

[54] NARROW BAND LEVEL DETECTOR FOR DETECTING A PERIODIC SIGNAL

[75] Inventor: Lars K. Nilsson, Norsborg, Sweden

[73] Assignee: Telefonaktiebolaget L M Ericsson, Stockholm, Sweden

[21] Appl. No.: 14,742

[22] Filed: Feb. 23, 1979

[30] Foreign Application Priority Data

Mar. 10, 1978 [SE] Sweden .............................. 7802765

[51] Int. Cl.³ .......................... H03K 9/06; H03B 1/04
[52] U.S. Cl. .................................... 328/138; 328/140; 328/167; 370/69
[58] Field of Search .................... 328/138, 140, 167; 307/233 R; 325/478

[56] References Cited

U.S. PATENT DOCUMENTS

| | | | |
|---|---|---|---|
| 3,636,446 | 1/1972 | Genter et al. ..................... | 328/138 X |
| 3,659,116 | 4/1972 | Sellers et al. ..................... | 307/233 R |
| 3,750,033 | 7/1973 | Fukata ................................. | 325/478 |
| 3,757,236 | 9/1973 | Langan ................................ | 328/167 |
| 3,912,916 | 10/1975 | Grün et al. ........................ | 328/167 X |

Primary Examiner—John S. Heyman
Attorney, Agent, or Firm—Hane, Roberts, Spiecens & Cohen

[57] ABSTRACT

A narrow band level detector for use in the frequency generating equipment of an FDM-system is described. The detector includes a product modulator one input of which receives a sine wave signal, the other input receiving an incoming signal containing the periodic signal which should be detected together with disturbing periodic signals. The sine wave signal has a determined amplitude and frequency and can be generated by an oscillator or by a phase locked loop. The output of the modulator is connected to a bandpass filter whose pass band substantially coincides with the sideband defined by the frequencies of the disturbing periodic signals. A first peak rectifier is via an amplifier connected to the output of the bandpass filter and a second peak rectifier is connected directly to the input of the detector to form a signal whose level corresponds to the maximum value of the signal from the amplifier and the detector input signal, respectively. These two signals are subtracted from each other in a subsequent adding circuit whose output signal level forms a value of the desired signal level.

1 Claim, 4 Drawing Figures

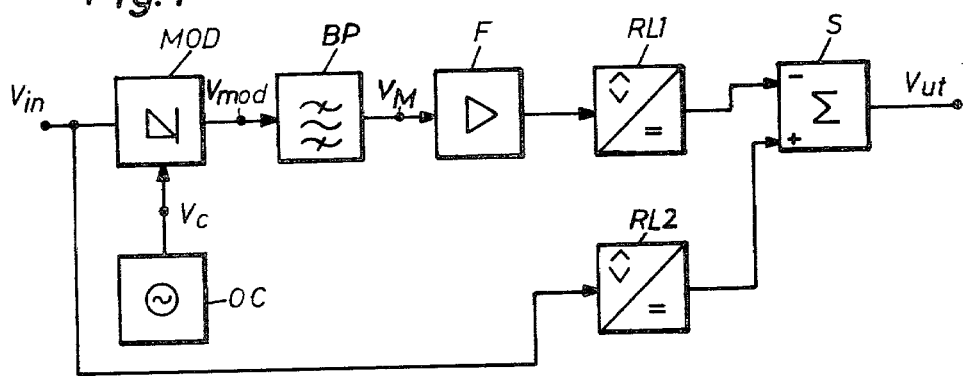
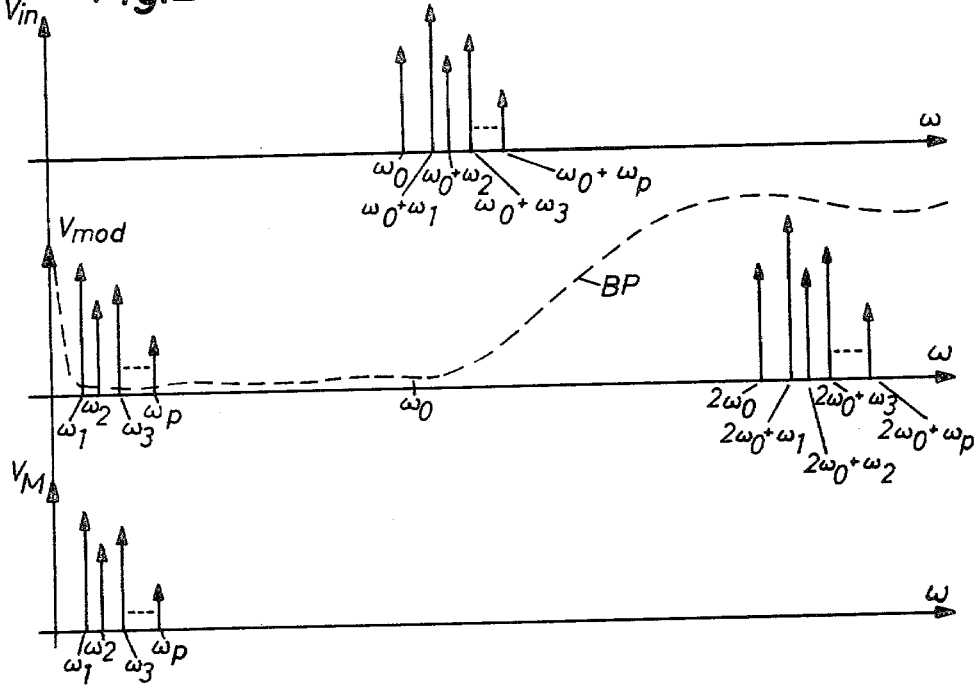

NARROW BAND LEVEL DETECTOR FOR DETECTING A PERIODIC SIGNAL

The present invention relates to a narrow band level detector for detecting a periodic signal among a number of other signals which are preferably periodic but which also can consist of narrow band non-periodic noise. Thus, the periodic signal which is to be detected, can be said to be embedded in the other signals, the frequencies of which are situated adjacently to the frequency of the desired periodic signal.

The level detector according to the invention is principally applicable to the frequency generating equipment of an FDM-system in which an incoming frequency comparing pilot of, for example, 60 kHz can be disturbed by signals from adjacent channels and thus has to be signal processed to eliminate the disturbing signals of the incoming pilot before generation of the required frequencies can be carried out. Such a frequency generating equipment for the present FDM-system is described in, for example, "Ericsson Review" No. 4, 1977, pages 174–179, in which, on page 178 in particular, the function of the through-connection unit is described, in which the recovering of the frequency comparing pilot before producing the desired frequency pilots by filtering is carried out.

Previously known methods for eliminating undesirable disturbing signals and level detecting of a determined periodic signal among a number of disturbing signals involve the filtering of the incoming composed signal by a narrow bandpass filter so that only the signal with the desired frequency will appear across the output of the filter and thus can easily be level detected. This method is advantageous when the periodic signal is included in a number of non-periodic signals but can imply unnecessary costs for the filter equipment in case the disturbing signals are periodic since it is difficult and time consuming to implement the narrow bandpass filter in order to obtain the sufficiently narrow band width to recover the desired periodic signal.

The level detector according to the present invention entirely avoids the problem of the above mentioned narrow bandpass filtering of the incoming composite signal and has the object to detect a periodic signal among a number of other periodic signals, whose frequencies, relatively the frequency of the desired signal, are situated so adjacent that conventional filter methods will be difficult to implement.

Figure 4:
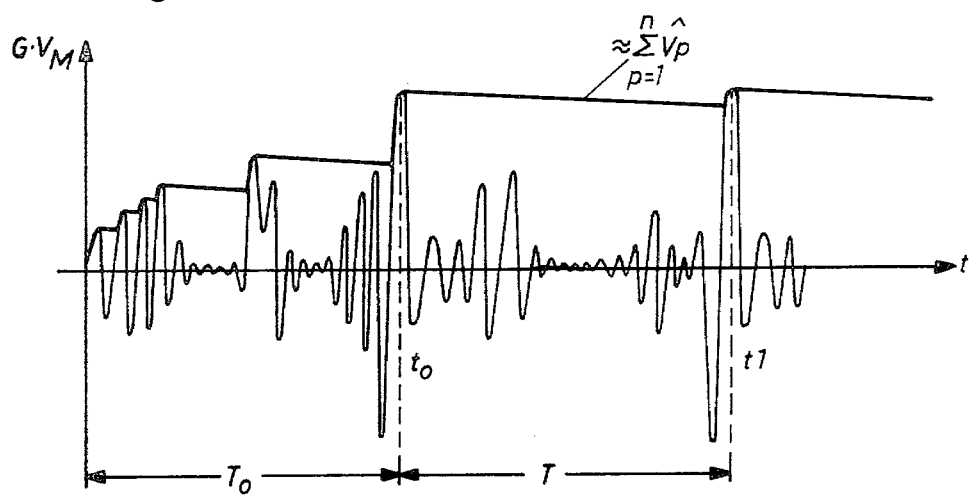

The invention, the characteristics of which appear from the appended claims, will be explained more fully with reference to the accompanying drawings in which FIG. 1 shows a block diagram of the level detector according to the invention, FIG. 2 shows a frequency diagram for certain signal quantities appearing in the embodiment according to FIG. 1, FIG. 3 shows a circuit diagram of an embodiment of certain blocks in the diagram according to FIG. 1, FIG. 4 shows a time diagram of certain signal quantities appearing in the circuit diagram according to FIG. 3.

In the block diagram according to FIG. 1, Vin symbolizes the signal incoming to the level detector containing on the one hand the periodic signal which will be detected and on the other hand the periodic signals which are superimposed on this and which have a disturbing effect. The input signal Vin is supplied to one input of a product modulator MOD, the second input of which is connected to a circuit device, for example, an oscillator OC but which can also consist of phase locked loop of known type. The oscillator OC delivers a sine wave signal Vc to the product modulator MOD, whose amplitude is of a determined value and whose frequency is equal to the frequency of the periodic signal, the level of which is to be detected. The output signal from the product modulator MOD is designated Vmod. If it is assumed that the input signal Vin is composed by a sine wave signal which, for example, represents a frequency pilot in an FDM-system and a number of n sine wave signals originating from certain speech channels in the system, Vin can be characterized as $$Vin = \hat{V}_o \cos \omega_o t + \sum_{p=1}^{n} \hat{V}_p \cos (\omega_o + \omega_p)t$$

where the frequencies $\omega_p$ are situated adjacently to $\omega_o$, i.e. $\omega_o >> \omega_p$ for all p. The oscillator OC delivers a signal $$Vc = \hat{V}_c \cos (\omega_o t + \phi)$$

where $\phi$ designates the phase position relatively the signal $\hat{V}_o \cos \omega_o t$.

The output signal Vmod from the product modulator MOD can then be characterized as $$Vmod = k_m Vin \, Vc = k_m \hat{V}_o \hat{V}_c \cos \omega_o t \cdot$$
$$\cos (\omega_o t + \phi) + k_m \hat{V}_c \sum_{p=1}^{n} \hat{V}_p$$
$$\cos (\omega_o + \omega_p)t \cdot \cos (\omega_o t + \phi) \text{ or }$$
$$Vmod = \tfrac{1}{2} k_m \hat{V}_o \hat{V}_c [\cos (2\omega_o t + \phi) + \cos \phi] + \tfrac{1}{2} k_m \hat{V}_c \sum_{p=1}^{n} \hat{V}_p$$
$$[\cos (2\omega_o + \omega_p)t + \phi] + \cos (\omega_p t + \phi)$$

where $k_m$ is a known constant characteristic for the modulator.

To the output of the modulator a bandpass filter BP of conventional type is connected, for example, an active filter with small demands on the slope of the characteristic between the pass- and stop bands. The filter BP is dimensioned in such a way that its passband substantially corresponds to the frequency band within which the frequency differences $\omega_p$ are located, i.e. within the lower frequency range (of the order of magnitude 0.1–10 kHz). Thus the passband of the filter BP substantially corresponds to the side band around the frequency $\omega_o$ in which the components of the disturbing periodic signals Vp cos $(\omega_o + \omega_p)$t (p=1, 2, ..., n) are located. Thus, across the output of the bandpass filter BP a signal $V_M$ is obtained, where $$V_M = \tfrac{1}{2} k_m \hat{V}_c \sum_{p=1}^{n} \hat{V}_p \cos (\omega_p t + \phi)$$

In FIG. 2 a frequency spectrum for the input signal Vin together with the spectrum for the output signals Vmod and $V_M$ are shown. In order to illustrate the characteristics of the filter BP its frequency characteristic is indicated by dashed lines by which it appears that small demands can be put regarding its selectivity.

The signal $V_M$, as the input signal Vin, consists of a number of sine wave signals i.e. each signal consisting of a so called beat. The maximum value of the respective signal is obtained at the moment when all the sine components included have their maximum value at the same time, i.e. when their maximum values coincide and this moment is regularly repeated. The period time T will then be determined by the period time of the individual sine components. When, for example, the signal $V_M$ contains five different sine components each with the period time 3, 5, 7, 11 and 15 units of time, the period for the maximum value of the beat will be $7 \times 11 \times 15 = 115$ units of time. For the signals Vin and $V_M$ is valid that their maximum values at the mentioned moments can characterized as $$(Vin)\max = \hat{V}_o + \sum_{p=1}^{n} \hat{V}_p \text{ and } (V_M)\max = \tfrac{1}{2}k_m \hat{V}_c \sum_{p=1}^{n} \hat{V}_p.$$

Across the output of the bandpass filter BP an amplifier F known per se, is connected which gives a constant phase shift for each sine component. To the output of the amplifier F and to the input of the level detector, peak rectifiers RL1 and RL2, respectively are connected, both outputs of which are connected to the negative and to the positive input, respectively of the adding circuit S, whose output forms the output of the detector. The amplifier F is assumed to have the amplification factor G and delivers via its output a signal $GV_M$ and both the peak rectifiers RL1 and RL2 detect the above mentioned maximum values of the signals $GV_M$ and Vin, respectively. Thus, a signal of the value $$\tfrac{1}{2}Gk_m \hat{V}_c \sum_{p=1}^{n} \hat{V}_p$$

is obtained across the output of the rectifier RL1, and across the output of the rectifier RL2, a signal of the following value is obtained $$\hat{V}_o + \sum_{p=1}^{n} \hat{V}_p.$$

Thus, the output signal Vut from the detector has the value $$V_{ut} = \hat{V}_o + \sum_{p=1}^{n} \hat{V}_p - \tfrac{1}{2}Gk_m \hat{V}_c \sum_{p=1}^{n} \hat{V}_p$$

The amplification factor G of the amplifier F can now be chosen so that the product $\tfrac{1}{2} Gk_m \hat{V}_c = 1$, since both $k_m$ and $\hat{V}_c$ are known quantities. Thus, $V_{ut} = \hat{V}_o$ whereby a detection of the level of the desired signal has been obtained.

The circuit diagram according to FIG. 3 shows an embodiment of the two peak rectifiers RL1, RL2 and the adding circuit S. The rectifier RL1, detecting the positive peak value of the signal $GV_M$, consists of an npn-transistor T1, whose base is connected to an RC-link consisting of the capacitor Co and the resistor Ro. The function of the RC-link is primarily to block a possible DC-component and very low frequent components, which appear across the input a. The collector of the transistor T1 is connected to a supply voltage Ucc and the emitter is connected to a capacitor C1, connected to earth potential. A resistor R is, via a first resistor R1 in the adding circuit S, connected across the capacitor C1, thus forming a timing circuit. In a similar way the peak rectifier RL2, detecting the negative peak value of the incoming signal Vin, is built up by the pnp-transistor T2, the RC-link RoCo and a timing circuit formed by the resistor R and by a second resistor R2 in the adding circuit S and the capacitor C2. The adding circuit S thus is formed by the resistors R1, R2 and are at the same time included in each of the timing circuits. The values of the resistors R1, R2 and R are chosen so that $R>>R1$, $R>>R2$ whereby the time constant is mainly determined by RC1 and RC2. The transistors T1 and T2 are primarily functioning to rectify an incoming signal (via the base-emitter junction) and can be replaced by ordinary diodes. The advantage of using transistors, as shown, is that a certain amplification of the signal currents to the input terminals a and b can be obtained.

The time diagram according to FIG. 4 illustrates the function of, for example, the peak value rectifier RL1, which receives the signal $GV_M$. The time space To shows the starting process when the capacitor C1 successively is charged by the incoming positive current peaks. During the charging space of the capacitor C1 the transistor T1 is conducting. At the time to, the maximum value of the incoming signal $GV_M$ appears, representing the value $$\sum_{p=1}^{n} \hat{V}_p$$

according to the above and the capacitor C1 is charged to its maximum value. During the time space T, corresponding to the above period time between two maximum values, the capacitor C1 is discharged a certain amount, indicated by the time constant $(R1+R)$ $C1 \approx RC1$. At the time t1, the incoming signal again has a maximum value and the transistor T1 is conducting and the capacitor C1 obtains an additional charge corresponding to the voltage increase up to the maximum value. In a similar way, a peak value rectification of the negative current peaks of the incoming signal Vin is obtained in the peak value rectifier RL2 consisting of the circuit T2, R, R2, C2. The output signal Vut is formed by the sum of the levels (with signs) of the rectified positive and negative current peaks of the signals $GV_M$ and Vin respectively, which according to the above forms the level Vo of the searched periodic signal $\hat{V}_o \cos \omega_o t$.

The level detector, as described above, works exactly at the presence of a periodic signal according to the calculations shown. Approximately, the same result is obtained when a narrow band noise appears instead of the periodic disturbing signal $$\sum_{p=1}^{n} \hat{V}_p \cos (\omega_o + \omega_p)t.$$

By "narrow band noise" is in this connection meant low frequency signals in which the quantities $\hat{V}_p$ and $\omega_p$ vary randomly. An accidentally high value of the input signal Vin corresponds to a high value of the signal $V_M$, due to which a corresponding disturbance supression is carried out in the adding circuit S. Since the noise does not occur periodically, the output signals of the peak value rectifiers RL1, RL2 will not be wholly constant but will get a slow, superimposed and small AC-component due to that the exact same peak value never occurs periodically at the times to, t1, etc. according to FIG. 4. Practical experiences, however, show that the variations caused by the AC-components are so small that a sufficient estimation of the desired level Vo can yet be obtained.

We claim:

1. A narrow band level detector for detecting, from an incoming signal to the detector, the level of periodic signal having a certain frequency of a number of disturbing especially periodic signals, the frequency components of which have their frequency positions within a side band of the periodic signal, comprising a circuit device to generate a periodic signal with a predetermined amplitude and a predetermined frequency equal to the frequency of said periodic signal, a modulator device connected to form the product of said incoming signal and said periodic signal, a filter device connected to said modulator device for recovering the frequency components of said number of disturbing periodic signals, an amplifier device connected to said filter device, and having a predetermined and for each of said frequency components constant phase shift for multiplying said components with a predetermined value, a first and a second peak value rectifier connected respectively to said amplifier device, and said incoming signal to form the peak value of the signal obtained from said amplifier device and to form the peak value of the incoming signal respectively, and a differential circuit connected to form the difference between the peak values, obtained from said rectifier, the difference representing a measure of the desired level of the periodic signal.

* * * * *